(12) United States Patent
Takaya

(10) Patent No.: US 8,598,652 B2
(45) Date of Patent: Dec. 3, 2013

(54) SEMICONDUCTOR DEVICE

(75) Inventor: Hidefumi Takaya, Miyoshi (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/499,599

(22) PCT Filed: Oct. 1, 2009

(86) PCT No.: PCT/JP2009/067186
§ 371 (c)(1),
(2), (4) Date: Mar. 30, 2012

(87) PCT Pub. No.: WO2011/039888
PCT Pub. Date: Apr. 7, 2011

(65) Prior Publication Data
US 2012/0187478 A1  Jul. 26, 2012

(51) Int. Cl.
H01L 29/76 (2006.01)
H01L 31/062 (2012.01)

(52) U.S. Cl.
USPC .......................................................... 257/331

(58) Field of Classification Search
USPC .................. 257/330–333, 341–342, E29.257; 438/259, 270–271
See application file for complete search history.

(56) References Cited

U.S. PATENT DOCUMENTS

| | | | |
|---|---|---|---|
| 5,981,996 A | 11/1999 | Fujishima | |
| 6,174,773 B1 | 1/2001 | Fujishima | |
| 2001/0025984 A1* | 10/2001 | Osawa | 257/330 |
| 2004/0065920 A1 | 4/2004 | Henson | |
| 2006/0208314 A1 | 9/2006 | Kaneko | |
| 2006/0289928 A1 | 12/2006 | Takaya et al. | |
| 2007/0262390 A1* | 11/2007 | Ishida et al. | 257/368 |
| 2008/0230787 A1 | 9/2008 | Suzuki et al. | |
| 2010/0276729 A1 | 11/2010 | Aoi et al. | |

FOREIGN PATENT DOCUMENTS

| | | |
|---|---|---|
| JP | 8-222735 A | 8/1996 |
| JP | 2001-094098 A | 4/2001 |
| JP | 2003-273354 A | 9/2003 |
| JP | 2005-005655 A | 1/2005 |
| JP | 2005-116822 A | 4/2005 |
| JP | 2006-093457 A | 4/2006 |

(Continued)

OTHER PUBLICATIONS

Translation of International Preliminary Report on Patentability mailed May 18, 2012 of PCT/JP2009/067186.

(Continued)

Primary Examiner — Theresa T Doan
(74) Attorney, Agent, or Firm — Kenyon & Kenyon LLP

(57) ABSTRACT

Provided is a semiconductor device capable of suppressing deterioration in characteristics even when an Avalanche phenomenon occurs in the semiconductor device. The semiconductor device includes a first conductive type drift region; a second conductive type body region disposed on a front surface side of the drift region; a gate trench penetrating the body region and extending to the drift region; a gate electrode disposed within the gate trench; an insulator disposed between the gate electrode and a wall surface of the gate trench; and a second conductive type diffusion region surrounding a bottom portion of the gate trench. An impurity concentration and dimension of the diffusion region are adjusted such that a breakdown is to occur at a p-n junction between the diffusion region and the drift region when an Avalanche phenomenon is occurring.

3 Claims, 10 Drawing Sheets

(56) References Cited

FOREIGN PATENT DOCUMENTS

| | | |
|---|---|---|
| JP | 2006-202940 A | 8/2006 |
| JP | 2006-245358 A | 9/2006 |
| JP | 2006-261184 A | 9/2006 |
| JP | 2007-258582 A | 10/2007 |
| JP | 2007-317779 A | 12/2007 |
| JP | 2008-235546 A | 10/2008 |
| WO | 2009/075200 A1 | 6/2009 |

OTHER PUBLICATIONS

Translation of International Search Report mailed Dec. 22, 2010 of PCT/JP2009/067186.
Translation of Invitation to Pay Additional Fees with Partial International Search Report mailed Nov. 2, 2009 of PCT/JP2009/067186.

* cited by examiner

SEMICONDUCTOR DEVICE

TECHNICAL FIELD

The present invention relates to trench gate type semiconductor device.

BACKGROUND ART

Japanese Patent Application Publication No. 2007-317779 discloses an exemplary trench gate type semiconductor device. The semiconductor device includes an n-type drift region and a p-type body region disposed on a front surface side of the drift region. In this semiconductor device, a gate trench penetrating the body region and extending to the drift region is formed. A gate electrode is disposed within the gate trench and opposes the body region with an insulator interposed therebetween. A p-type diffusion region is formed in a region surrounding a bottom portion of the gate trench.

SUMMARY OF INVENTION

Technical Problem

In such a semiconductor device, an Avalanche test is typically conducted to evaluate the reliability of the semiconductor device. However, it has turned out that an Avalanche phenomenon that occurs in the conventional semiconductor device deteriorates the characteristics of the semiconductor device. The present invention aims to provide a semiconductor device capable of suppressing deterioration in the characteristics even when the Avalanche phenomenon occurs in the semiconductor device.

Solution to Technical Problem

The inventor of the present invention has searched for the cause of the deterioration in the characteristics of the semiconductor device due to the Avalanche phenomenon. As a result, the inventor of the present invention has found that the characteristics of the semiconductor device are deteriorated by the behavior of carriers generated during the Avalanche phenomenon. Specifically, in the conventional semiconductor device, a breakdown occurs at a p-n junction between the body region and the drift region when the Avalanche phenomenon occurs. The carriers (holes) generated by the breakdown are collected near the gate electrode, and some of the carriers are accumulated in the insulator near the gate electrode. When the carriers (holes) are accumulated in the insulator, a gate capacitance increases, which causes deterioration in the characteristics (for example, a switching characteristic) of the semiconductor device. Particularly when the Avalanche phenomenon continuously occurs in the semiconductor device as in continuous Avalanche tests, the amount of carriers (holes) accumulated in the insulator is large, so that the effect of the carriers (holes) is large.

A semiconductor device according to an exemplary aspect of the present invention includes a first conductive type drift region, a second conductive type body region, a gate trench, a gate electrode, an insulator, and a second conductive type diffusion region. The body region is disposed on a front surface side of the drift region. The gate trench penetrates the body region and extends to the drift region. The gate electrode is disposed within the gate trench and opposes the body region. The insulator is disposed between the gate electrode and a wall surface of the gate trench. The diffusion region surrounds a bottom portion of the gate trench and is surrounded by the drift region. An impurity concentration of the diffusion region is set to be higher than that of the body region.

The terms "first conductive type" and "second conductive type" refer to one of n-type and p-type. Specifically, when the "first conductive type" is n-type, the "second conductive type" is p-type, and when the "first conductive type" is p-type, the "second conductive type" is n-type.

In this semiconductor device, an impurity concentration of the diffusion region surrounding a bottom portion of the gate trench is higher than that of the body region. Accordingly, when an Avalanche phenomenon occurs in the semiconductor device, a breakdown is to occur not at a p-n junction between the body region and the drift region but at a p-n junction between the diffusion region and the drift region. Since the breakdown is to occur at a p-n junction away from the gate electrode (i.e., at the p-n junction between the diffusion region and the drift region), the amount of carriers collected near the gate electrode can be reduced and the amount of carriers accumulated in the insulator near the gate electrode can also be reduced. This leads to suppression of an increase in the gate capacitance and suppression of deterioration in characteristics of the semiconductor device.

In this semiconductor device, a plurality of gate trenches, may be disposed in a predetermined direction with an interval between one another. In this case, the gate electrode and the insulator are disposed within each gate trench, and the second conductive type diffusion region is provided at the bottom portion of each gate trench so as to surround the bottom portion.

In a case where the semiconductor device includes a plurality of gate trenches, a width of each diffusion region in a gate trench disposing direction is preferably longer than that of the diffusion region by which a breakdown voltage of the semiconductor device becomes maximum when the width of the diffusion region is changed, and is preferably shorter than a width of the diffusion region by which adjacent diffusion regions contact each other. The increase in the width of the diffusion region allows the breakdown to preferably occur at the p-n junction between the diffusion region and the drift region.

Further, in the drift region, an impurity concentration of a part near a side wall surface of the gate trench in the gate trench disposing direction may be lower than that of a central part between adjacent gate trenches. As a result, the electric resistance of the drift region near the side-wall surface of the gate trench is increased, thereby preventing carriers from being collected near the gate electrode.

The semiconductor device may further include a blocking region protruding from the side wall surface of the gate trench in the gate trench disposing direction to the drift region, and blocking a carrier flow from the diffusion region toward the gate electrode. The formation of the blocking region prevents carriers from being collected toward the gate electrode.

DESCRIPTION OF EMBODIMENTS

First Embodiment

Figure 1:
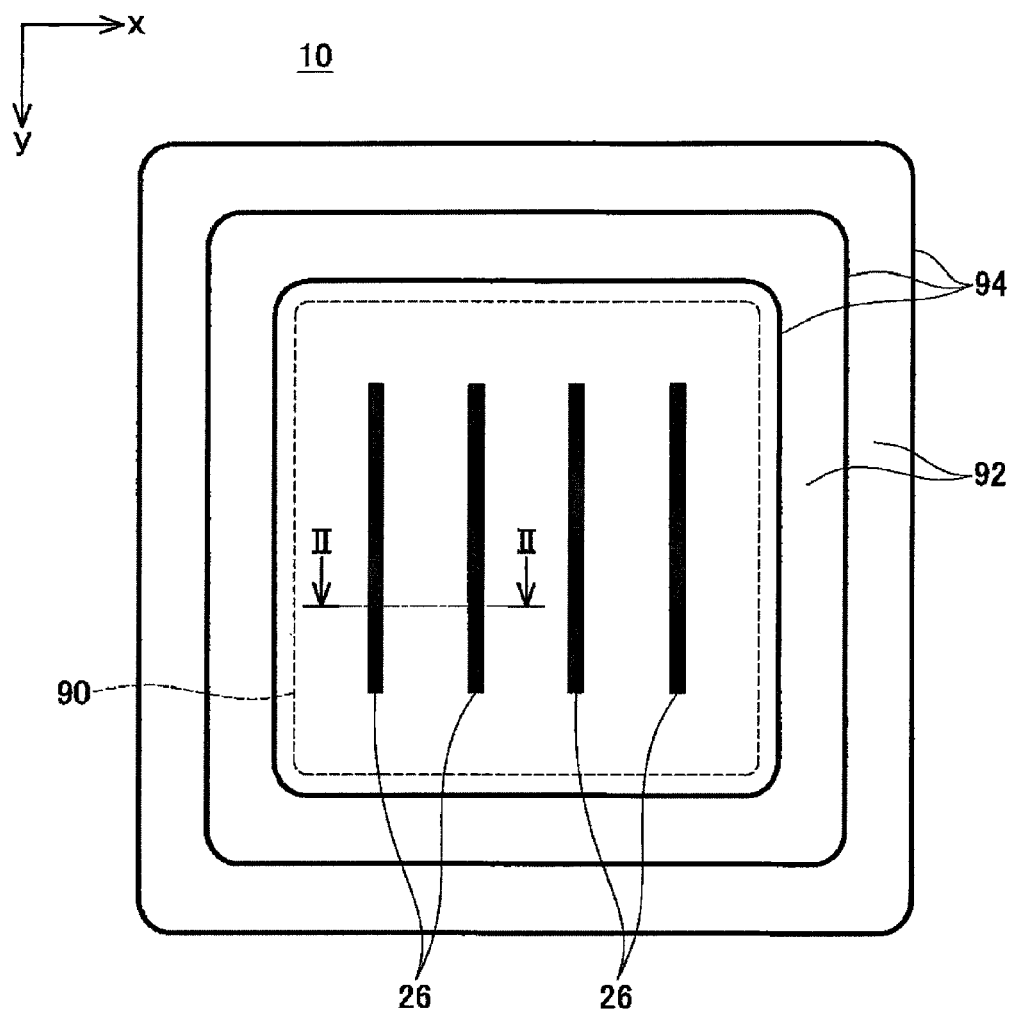
FIG. 1 is a plan view of a semiconductor device of a first embodiment.

A semiconductor device 10 of a first embodiment will be described with reference to the drawings. As shown in FIG. 1, the semiconductor device 10 includes a cell region 90 having semiconductor elements formed therein, and a terminal region 92 surrounding the cell region 90. Note that in FIG. 1, illustration of electrodes or the like formed on an upper surface of the semiconductor substrate is omitted. A plurality of gate trenches 26 is formed in the cell region 90. The gate trenches 26 extend in a y-direction of FIG. 1 and are disposed with an interval between one another in an x-direction of FIG. 1. That is, the x-direction of FIG. 1 corresponds to a direction in which the gate trenches 26 are disposed. Terminal trenches 94 are formed in the terminal region 92. The terminal trenches 94 are formed around the cell region 90. The cell region 90 and the terminal region 92 are formed on the same semiconductor substrate. A well-known substrate (for example, a silicon (Si) substrate or a silicon carbide (SIC) substrate) may be used as the semiconductor substrate.

Figure 2:
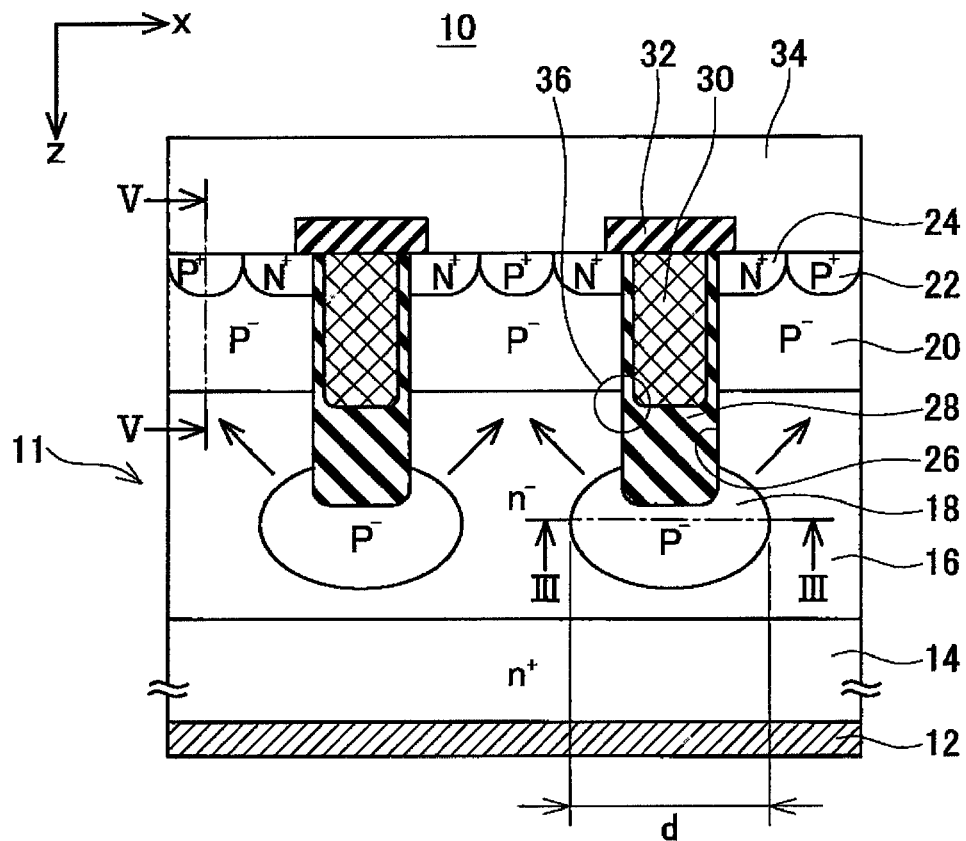
FIG. 2 is a sectional view taken along the line of FIG. 1.

As shown in FIG. 2, vertical field-effect transistors (MOSFETs) are formed on a semiconductor substrate 11. The gate trenches 26 are formed on an upper surface of the semiconductor substrate 11. The gate trenches 26 penetrate a source region 24 and a body region 20, which will be described later, and a lower end of each of the gate trenches 26 extends to a drift region 16. A gate electrode 30 is formed in each of the gate trenches 26. The gate electrode 30 is formed such that a lower end of the gate electrode 30 is located at a position slightly deeper than a lower surface of the body region 20. An insulator 28 is filled between a wall surface of each of the gate trenches 26 and the gate electrode 30 (i.e., at the sides and below the gate electrode 30). Accordingly, the gate electrode 30 opposes the body region 20 and the source region 24 with the insulator 28 interposed therebetween. A cap insulating film 32 is formed above the gate electrode 30.

The n$^+$-type source region 24 and a p$^+$-type body contact region 22 are formed in a region facing the upper surface of the semiconductor substrate 11. The source region 24 is formed to contact the insulator 28. The body contact region 22 is formed to contact the source region 24.

The p$^-$-type body region 20 is formed below the source region 24 and the body contact region 22. The impurity concentration of the body region 20 is lower than that of the body contact region 22. The impurity concentration of the body region 20 may be set e.g. to 0.5 to $5.0 \times e^{17}$ cm$^{-3}$. The body region 20 contacts each of the source region 24 and the body contact region 22, and also contacts the insulator 28 at the lower side of the source region 24. Thus, the source region 24 is surrounded by the body region 20 and the body contact region 22.

The n$^-$-type drift region 16 is formed below the body region 20. The impurity concentration of the drift region 16 may be set e.g. to $1.0 \times e^{15}$ to $1.0 \times e^{17}$ cm$^3$. The drift region 16 contacts the lower surface of the body region 20. The drift region 16 is separated from the source region 24 by the body region 20.

In the drift region 16, a p$^-$-type diffusion region 18 is formed in a region surrounding a bottom portion of each of the gate trenches 26. The diffusion region 18 contacts the insulator 28 below the gate electrode 30 (i.e., at a bottom portion of the gate trench 26). The diffusion region 18 is surrounded by the drift region 16. As a result, the diffusion region 18 is separated from the body region 20. The impurity concentration and the size of the diffusion region 18 will be described in detail later.

An n$^+$-type drain region 14 is formed in a region facing the lower surface of the semiconductor substrate 11. The impurity concentration of the drain region 14 may be set e.g. to $1.0 \times e^{18}$ to $5.0 \times e^{19}$ cm$^{-3}$. The drain region 14 contacts the lower surface of the drift region 20. The drain region 14 is separated from the body region 20 by the drift region 16.

A drain electrode 12 is formed on the lower surface of the semiconductor substrate 11. The drain electrode 12 is in ohmic contact with the drain region 14. A source electrode 34 is formed on the upper surface of the semiconductor substrate 11. The source electrode 34 is formed to cover the cap insulating film 32, and is insulated from the gate electrode 30. The source electrode 34 is in ohmic contact with each of the source region 24 and the body contact region 22.

In the case of using the semiconductor device 10 described above, the drain electrode 12 is connected to a power supply potential, and the source electrode 34 is connected to a ground potential. When the potential of the gate electrode 30 is lower than a threshold potential, the semiconductor device 11 turns off. When the potential of the gate electrode 30 is equal to or higher than the threshold potential, the semiconductor device 11 turns on. In other words, a channel is formed in the body region 20 in a region in contact with the gate insulator 28. This allows electrons to flow from the source electrode 34 to the drain electrode 12 through the source region 24, the channel of the body region 20, the drift region 16, and the drain region 14. That is, current flows from the drain electrode 12 to the source electrode 34.

Next, the impurity concentration and the size of the diffusion region 18 will be described. The impurity concentration and the size of the diffusion region 18 are adjusted such that a breakdown is to occur at a p-n junction between the diffusion region 18 and the drift region 16 when an Avalanche phenomenon is occurring in the semiconductor device 10. Specifically, in the semiconductor device in which the diffusion region in a floating state is formed below each gate trench, as in this embodiment, a depletion layer extends over a p-n junction between the body region and the drift region and the p-n junction between the diffusion region and the drift region, thereby ensuring a high drain-source breakdown voltage. Accordingly, when an Avalanche phenomenon occurs in the semiconductor device 10, a breakdown is to occur at one of the p-n junction between the body region and the drift region and the p-n junction between the diffusion region and the drift region. In this embodiment, the impurity concentration and the size of the diffusion region 18 are adjusted such that a breakdown is to occur at the p-n junction between the diffusion region 18 and the drift region 16 during the Avalanche phenomenon.

As a method for causing a breakdown at the p-n junction between the diffusion region 18 and the drift region 16 during the Avalanche phenomenon, the impurity concentration of the diffusion region 18 is set to be higher than that of the body region 20. In this case, the size (the width in the x-direction, and the like) of the diffusion region 18 can be appropriately determined in consideration of other characteristics (such as a breakdown voltage and an on-resistance) required for the semiconductor device 10. For example, the p-type impurity concentration of the body region 20 is set to 1.0 to $4.0 \times e^{16}$ cm$^{-3}$, and the p-type impurity concentration of the diffusion region 18 is set to 1.5 to $4.5 \times e^{17}$ cm$^{-3}$ which is higher than the p-type impurity concentration of the body region 20. This allows a breakdown to occur at the p-n junction between the diffusion region 18 and the drift region 16 during the Avalanche phenomenon.

The diffusion region 18 and the body region 20, which are described above, can be formed by a well-known method. For example, the diffusion region 18 and the body region 20 can be formed by implanting a p-type impurity into the semiconductor substrate 11 and by thermally diffusing the implanted p-type impurity. In this case, the impurity concentration and the size of each of the diffusion region 18 and the body region 20 can be controlled by adjusting the amount of the implanted p-type impurity and the thermal diffusion time.

Figure 3:
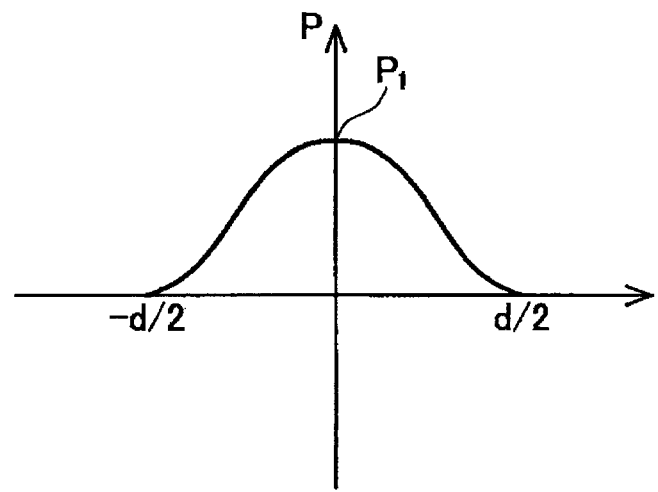
FIG. 3 is a graph showing an impurity concentration distribution within a diffusion region (an impurity concentration distribution taken along the line III-III of FIG. 1).
Figure 5:
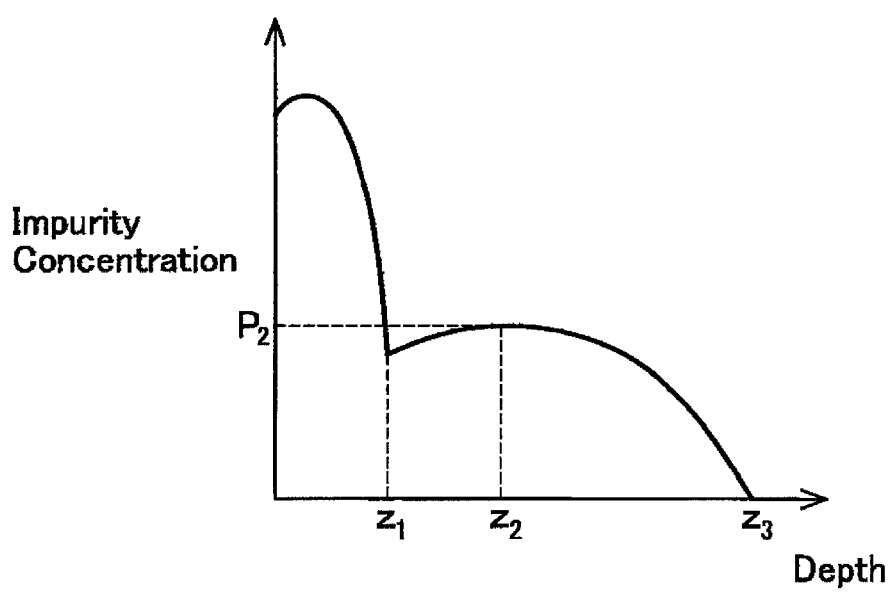
FIG. 5 is a graph showing an impurity concentration distribution in a depth direction within a body region (an impurity concentration distribution taken along the line V-V of FIG. 1).

In the case of forming the diffusion region 18 and the body region 20 by such a method, the impurity concentration of the diffusion region 18 is not constant, and the impurity concentration of the body region 20 is also not constant. Specifically, as shown in FIG. 3, the impurity concentration of the diffusion region 18 has a peak value $P_1$ (maximum value) at the center of the diffusion region 18, and decreases toward the boundary with the drift region 16. On the other hand, as shown in FIG. 5, the impurity concentration of the body region 20 changes in the depth direction and has a peak value $P_2$ (maximum value) at a depth $z_2$. In FIG. 5, a region having a depth in the range of 0 to $z_1$ corresponds to the body contact region 22, and a region having a depth in the range of $z_1$ to $z_3$ corresponds to the body region 20.

In this case, the peak value $P_1$ of the impurity concentration of the diffusion region 18 and the peak value $P_2$ of the impurity concentration of the body region 20 can be adjusted e.g. such that a ratio ($P_1/P_2$) falls within the range of 1.1 to 10. The peak value ratio ($P_1/P_2$) is set within the range of 1.1 to 10, thereby allowing the breakdown to stably occur at the p-n junction between the diffusion region 18 and the drift region 16 during the Avalanche phenomenon.

Figure 4:
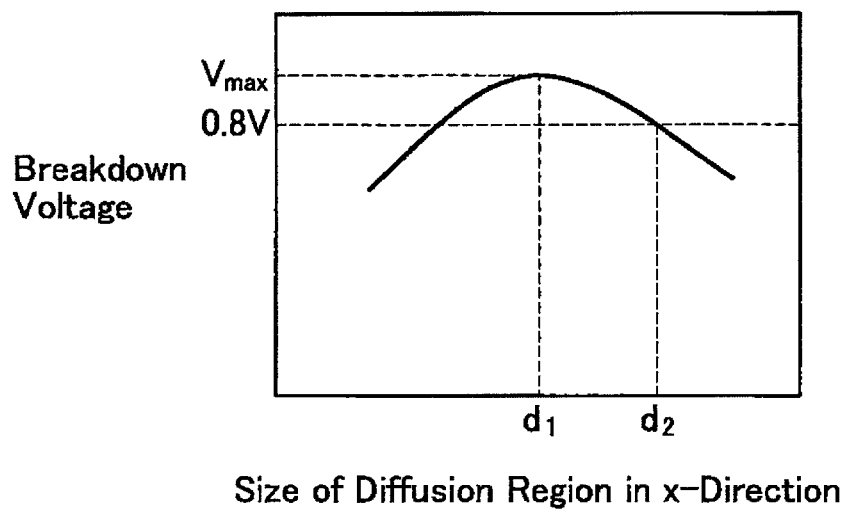
FIG. 4 is a graph showing a relationship between a width in an x-direction of the diffusion region and a breakdown voltage of the semiconductor device.

As another method for causing the breakdown at the p-n junction between the diffusion region 18 and the drill region 16 during the Avalanche phenomenon, the size of the diffusion region 18 is set to be larger than the conventional size. Specifically, the width in the x-direction (gate trench disposing direction) of the diffusion region 18 is set to be longer than the conventional width. In other words, when the width in the x-direction of the diffusion region 18 is changed, the breakdown voltage of the semiconductor device 10 changes. As shown in FIG. 4, when the width in the x-direction of the diffusion region 18 is $d_1$, the breakdown voltage of the semiconductor device 10 becomes a maximum value $V_{max}$. When the width in the x-direction of the diffusion region 18 exceeds $d_1$, the breakdown voltage of the semiconductor device 10 decreases. In this embodiment, the width in the x-direction of the diffusion region 18 is set to be longer than $d_1$, thereby allowing the breakdown to preferably occur at the p-n junction between the diffusion region 18 and the drift region 16.

The width in the x-direction of the diffusion region 18 is set such that the adjacent diffusion regions 18 do not contact each other. This is because a space in which carriers move can be ensured when the semiconductor device 10 turns on. As shown in FIG. 4, when the width in the x-direction of the diffusion region 18 exceeds $d_1$, the breakdown voltage of the semiconductor device 10 decreases and the on-resistance of the semiconductor device 10 increases. For this reason, the width in the x-direction of the diffusion region 18 is preferably set to be equal to or less than "$d_2$" shown in FIG. 4. The width "$d_2$" is a width at which the breakdown voltage of the semiconductor device 10 is $0.8 \times V_{max}$. The width in the x-direction of the diffusion region 18 is set to be equal to or less than $d_2$, thereby suppressing a decrease in the breakdown voltage and an increase in the on-resistance of the semiconductor device 10, while allowing the breakdown to occur at the p-n junction between the diffusion region 18 and the drift region 16. Accordingly, the width in the x-direction of the diffusion region 18 is preferably determined within the range of $d_1$ to $d_2$. The values $d_1$ and $d_2$ may be determined by experiments or calculations using a device simulator.

When the width in the x-direction of the diffusion region 18 is set to be longer than d1, the p-type impurity concentration of the diffusion region 18 can be appropriately determined in consideration of other characteristics required for the semiconductor device 10. The p-type impurity concentration of the diffusion region 18 may be set to be higher than that of the body region 20. This allows the breakdown to stably occur at the p-n junction between the diffusion region 18 and the drift region 16 during the Avalanche phenomenon.

Next, a description will be given of the operation of the semiconductor device 10 when an Avalanche test is carried out. The Avalanche test can be carried out by a well-known method. Specifically, the drain electrode 12 of the semiconductor device 10 is connected to the power supply potential via a coil. The source electrode 34 of the semiconductor device 10 is connected to the ground potential. In this state, a pulse voltage is applied to the gate electrode 30. When the pulse voltage is applied to the gate electrode, the semiconductor device 10 turns on for a predetermined period of time, and then turns off. When the semiconductor device 10 turns on, current flows through the semiconductor device 10 and energy is accumulated in the coil. When the semiconductor device 10 turns off, a large counter-electromotive force is generated in the coil due to the energy accumulated in the coil. When the counter-electromotive force generated in the coil acts on the semiconductor device 10, the Avalanche phenomenon occurs in the semiconductor device 10.

When the Avalanche phenomenon occurs in the semiconductor device 10, the breakdown is to occur at the p-n junction between the diffusion region 18 and the drift region 16. When the breakdown occurs at the p-n junction between the diffusion region 18 and the drift region 16, many of holes generated by the breakdown flow in directions indicated by arrows in FIG. 2 toward the source electrode 34 through the body region 20 and the body contact region 22. This prevents the holes generated by the breakdown from being collected near the gate electrode 30, and also prevents the holes from being accumulated in the insulator 28 near the gate electrode 30.

In the conventional semiconductor device, the breakdown had occurred at the p-n junction between the body region 20 and the drift region 16. Accordingly, the breakdown occurs near the gate electrode 30, so that many holes are collected near the gate electrode 30. As a result, a large number of holes is accumulated in the insulator 28 near the gate electrode 30 (i.e. in a part denoted by reference numeral 36 in FIG. 2).

As is obvious from the above description, in the semiconductor device 10 of this embodiment, the holes are prevented from being collected near the gate electrode 30 and the holes are prevented from being accumulated in the insulator 28 near the gate electrode 30 when the Avalanche phenomenon is occurring. This makes it possible to suppress an increase in the gate capacitance and deterioration in characteristics (for example, a switching characteristic) of the semiconductor device 10 due to the Avalanche phenomenon. Moreover, the holes are prevented from being accumulated in the insulator 28, thereby effectively suppressing deterioration in characteristics of the semiconductor device 10 even in the case where a continuous Avalanche tests are conducted.

Second Embodiment

Figure 6:
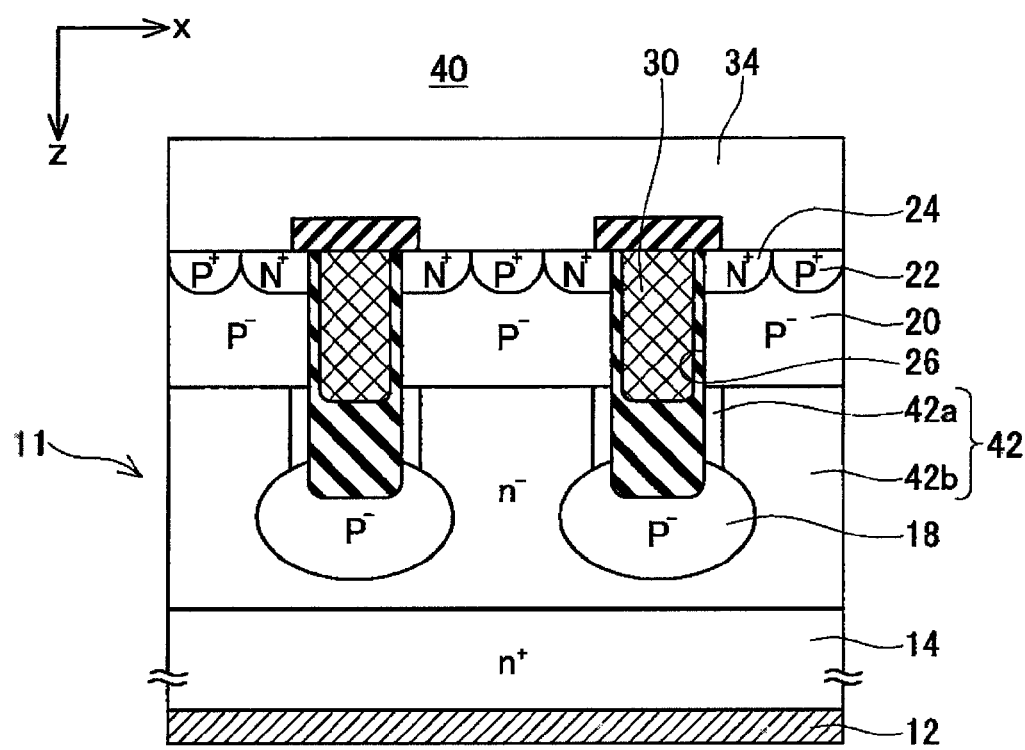
FIG. 6 is a sectional view showing a configuration of a semiconductor device of a second embodiment.

A semiconductor device 40 of a second embodiment will be described with reference to FIG. 6. In FIG. 6, components identical with those of the semiconductor device 10 of the first embodiment are denoted by the same reference numerals as those of the first embodiment.

As shown in FIG. 6, the semiconductor device 40 of the second embodiment differs from the semiconductor device of the first embodiment in that an $n^-$-type drift region 42 includes a low-concentration drift region 42a having a low impurity concentration and a high-concentration drift region 42b having an impurity concentration higher than that of the low-concentration drift region 42a. The low-concentration drift region 42a is formed near a side wall surface of the gate trench 26 in the gate trench disposing direction (i.e., x-direction). The high-concentration drift region 42b is formed in a central part of the adjacent gate trenches 26 (between the adjacent low-concentration drift regions 42a). The low-concentration drift region 42a has an impurity concentration lower than that of the high-concentration drift region 42b, and thus has an electric resistance higher than that of the high-concentration drift region 42b.

In the semiconductor device 40, the low-concentration drift region 42a having a high electric resistance is formed near a side wall surface of the gate trench 26, and the high-concentration drift region 42b having a low electric resistance is formed at a location apart from each of the gate trenches 26. Accordingly, holes generated by a breakdown occurring at the p-n junction between the diffusion region 18 and the drift region 16 hardly flow through the low-concentration drift region 42a, but are liable to flow through the high-concentration drift region 42b. As a result, the holes are further prevented from being collected near the gate electrode 30.

Figure 7:
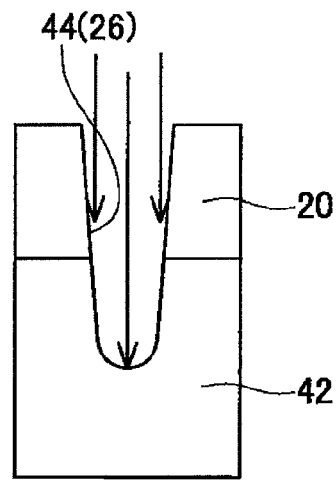
FIG. 7 is a diagram for explaining a method for manufacturing the semiconductor device of the second embodiment.

Now, an exemplary method for forming the low-concentration drift region 42a will be described. As shown in FIG. 7, in this formation method, a trench 44 (which thereafter serves as the gate trench 26) is formed in a tapered shape. Then, a p-type impurity is implanted into a bottom portion of the trench 44 to thereby form the diffusion region 18 at the bottom portion of the trench 44. In this case, an acceleration voltage for the p-type impurity to be implanted is set to a higher value. Since the trench 44 is formed into the tapered shape, a small amount of p-type impurity is also implanted into a side wall surface of the trench 44. As a result, the impurity concentration of the drift region 42 near the side wall surface of the trench 44 decreases, so that the low-concentration drift region 42a is formed. This method only requires to form the trench 44 (gate trench 26) into a tapered shape, thereby facilitating the formation of the low-concentration drift region 42a.

In the semiconductor device 40 shown in FIG. 6, the low-concentration drift region 42a is formed in the entire depth range from the body region 20 to the diffusion region 18. However, the technique of the present invention is not limited to such a mode. The low-concentration drift region may be formed in at least a part of the depth range from the body region 20 to the diffusion region 18.

Third Embodiment

Figure 8:
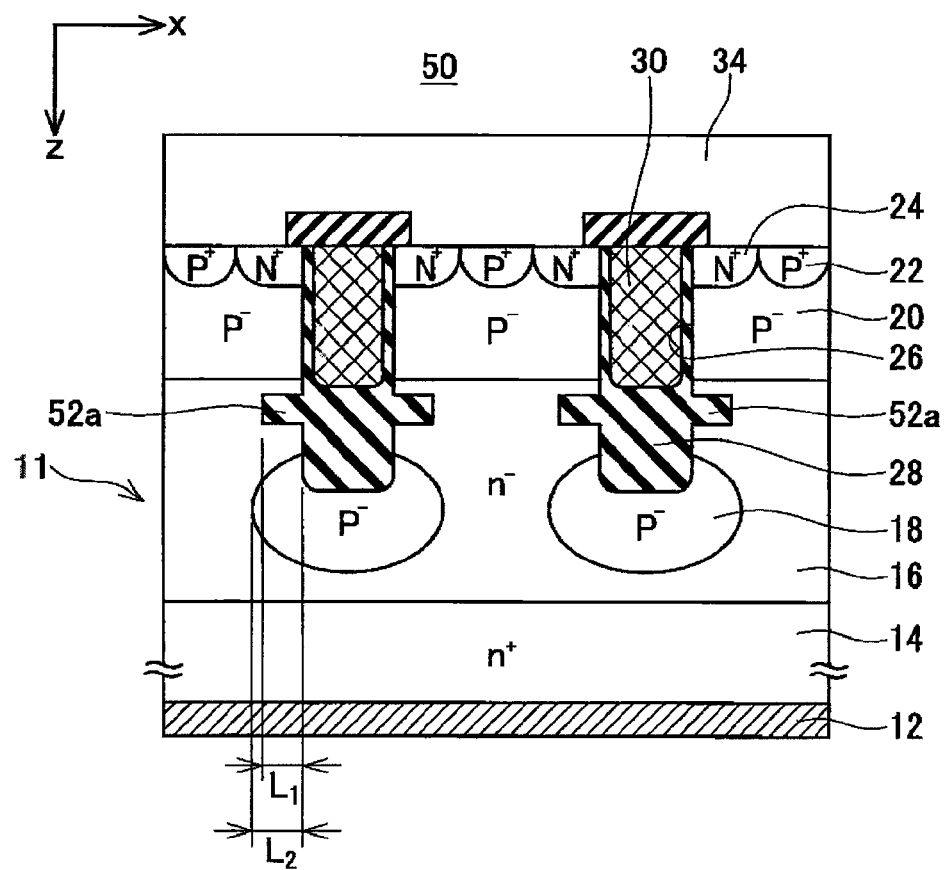
FIG. 8 is a sectional view showing a configuration of a semiconductor device of a third embodiment.

A semiconductor device 50 of a third embodiment will be described with reference to FIG. 8. Also in FIG. 8, components identical with those of the semiconductor device 10 of the first embodiment are denoted by the same reference numerals as those of the first embodiment.

The semiconductor device 50 of the third embodiment differs from the semiconductor device of the first embodiment in that a blocking region 52a is formed at a depth between the body region 20 and the diffusion region 18. The blocking region 52a is made of an insulating material, and is integrated with the insulator 28 filled in each of the gate trenches 26. The blocking region 52a extends in the x-direction from a side wall surface of each of the gate trenches 26 and protrudes to the drift region 16.

In the semiconductor device 50, the blocking region 52a protruding from the side wall surface of each of the gate trenches 26 in the x-direction is formed. Accordingly, the blocking region 52a prevents holes generated by a breakdown at the p-n junction between the diffusion region 18 and the drift region 16 from moving toward the gate electrode 30. This results in effectively preventing the holds from being collected near the gate electrode 30.

A protruding length $L_1$ of the blocking region 52a from the side wall surface of each gate trench can be appropriately determined depending on the magnitude of deterioration in characteristics due to the Avalanche phenomenon. When the deterioration in characteristics due to the Avalanche phenomenon is small, the protruding length $L_1$ is preferably set to be smaller than a protruding length $L_2$ from the side wall surface of the gate trench of the diffusion region 18. In this configuration, a large space in which current flows to the side surface of each of the gate trenches 26 when the semiconductor device 50 turns on can be ensured, and an increase in the on-resistance of the semiconductor device 50 can be suppressed. On the other hand, when the deterioration in characteristics due to the Avalanche phenomenon is large, the protruding length $L_1$ of the blocking region 52a may be set to be larger than the protruding length $L_2$ of the diffusion region 18. As a result, the deterioration in the characteristics of the semiconductor device 50 can be effectively suppressed.

Figure 9:
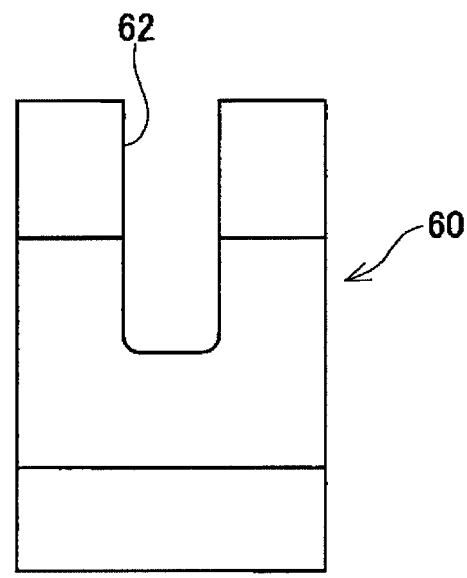
FIG. 9 is a diagram for explaining a method for manufacturing the semiconductor device of the third embodiment.
Figure 10:
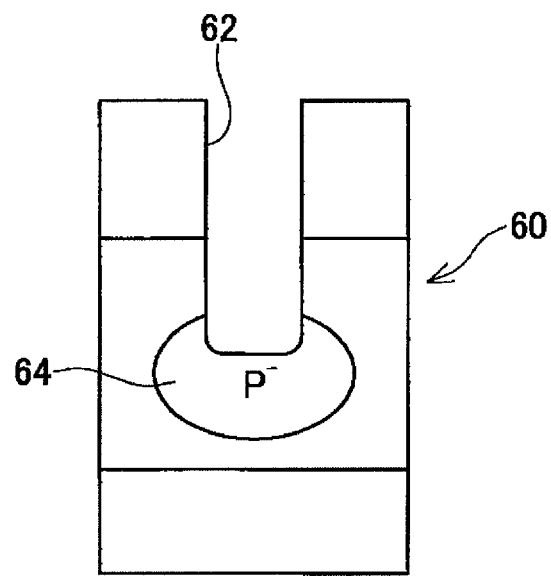
FIG. 10 is a diagram for explaining a method for manufacturing the semiconductor device of the third embodiment.
Figure 11:
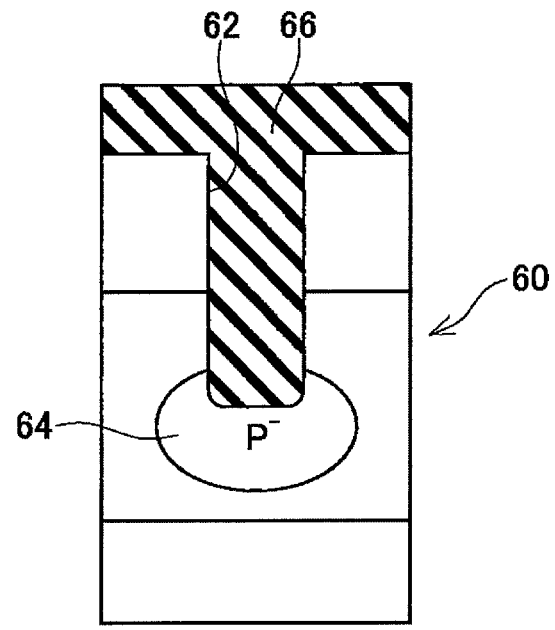
FIG. 11 is a diagram for explaining a method for manufacturing the semiconductor device of the third embodiment.
Figure 12:
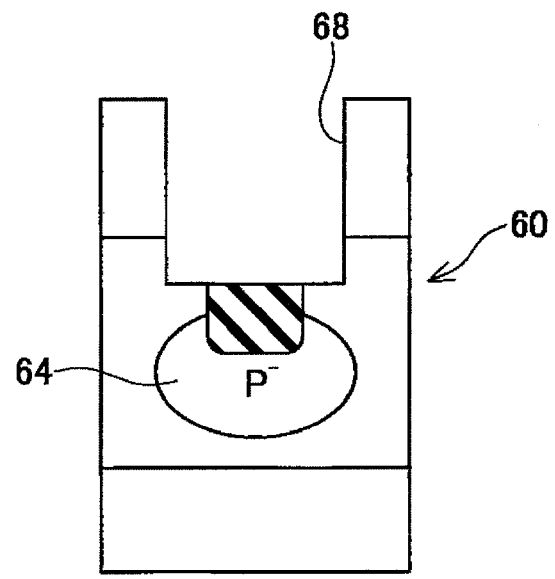
FIG. 12 is a diagram for explaining a method for manufacturing the semiconductor device of the third embodiment.
Figure 13:
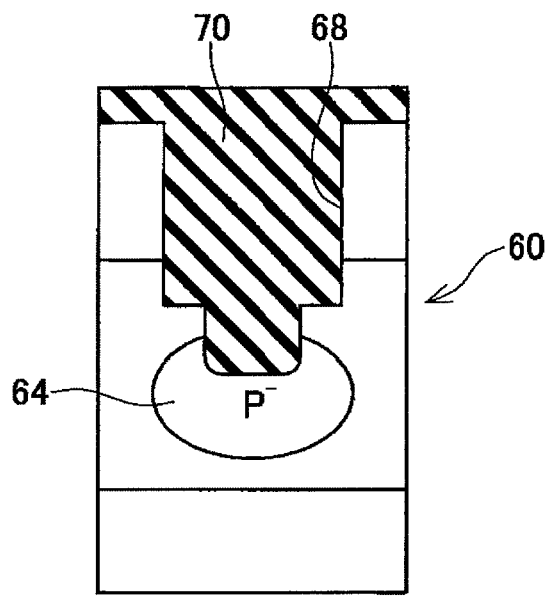
FIG. 13 is a diagram for explaining a method for manufacturing the semiconductor device of the third embodiment.
Figure 14:
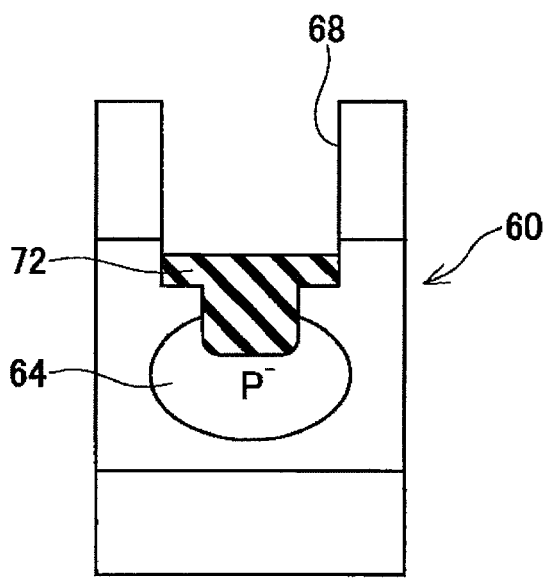
FIG. 14 is a diagram for explaining a method for manufacturing the semiconductor device of the third embodiment.
Figure 15:
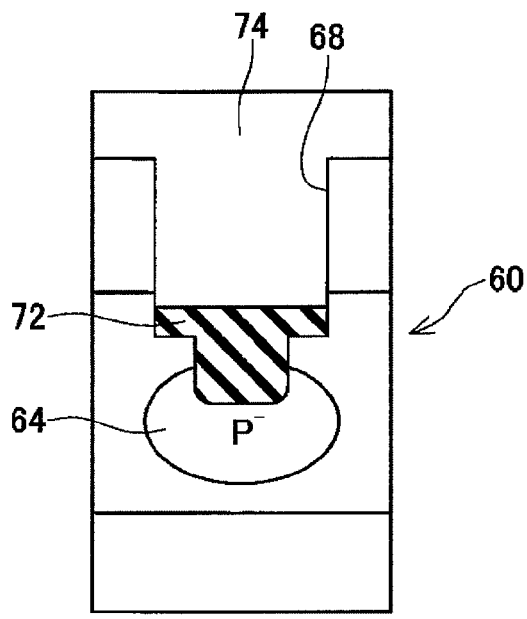
FIG. 15 is a diagram for explaining a method for manufacturing the semiconductor device of the third embodiment.
Figure 16:
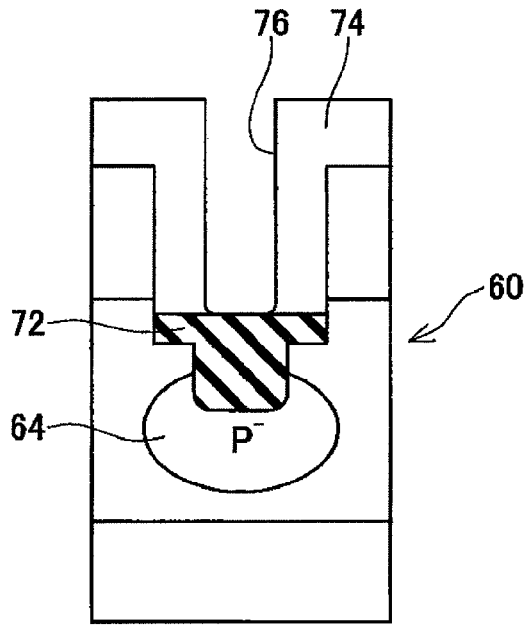
FIG. 16 is a diagram for explaining a method for manufacturing the semiconductor device of the third embodiment.
Figure 17:
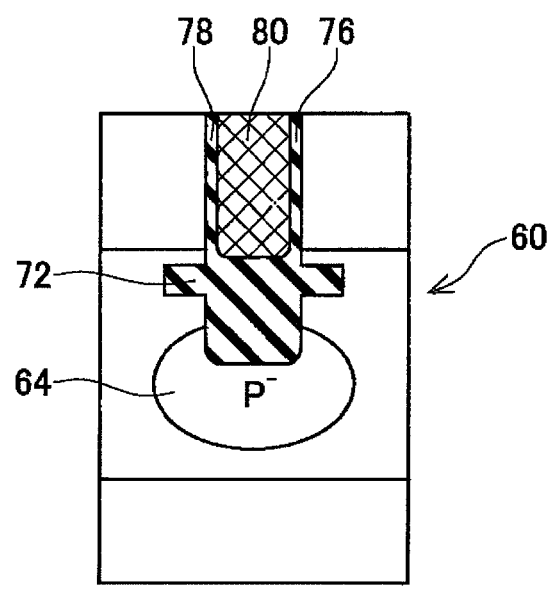
FIG. 17 is a diagram for explaining a method for manufacturing the semiconductor device of the third embodiment.

Now, an exemplary method for forming the blocking region 52a will be described. As shown in FIG. 9, a semiconductor substrate 60 is first subjected to dry etching to thereby form a trench 62. Then, a thin oxide film (insulator) (not shown) is formed on the wall surface of the trench 62. After that, a p-type impurity is implanted into a bottom portion of the trench 62, thereby forming a diffusion region 64 at the bottom portion of the trench 62 (see FIG. 10). An oxide film 66 is filled into the gate trench 62 by CVD (Chemical Vapor Deposition) method (see FIG. 11). The semiconductor substrate 60 is subjected to dry etching, thereby forming an opening 68 for forming a blocking region (see FIG. 12). An oxide film 70 is filled into the opening 68 by CVD method (see FIG. 13). The oxide film 70 except for a portion 72 serving as the blocking region is removed by etching (see FIG. 14). A semiconductor layer 74 is epitaxially grown within the opening 68 (see FIG. 15). The semiconductor layer 74 is subjected to dry etching, thereby forming a trench 76 (which thereafter serves as the gate trench 26) (see FIG. 16). An insulator 76 is formed on the wall surface of the trench 76, and a gate material 80 (a polysilicon film) is filled therein. Thus, the blocking region protruding from the side wall surface of the gate trench to the drift region can be formed.

The first to third embodiments have been described in detail above, but the technique of the present invention is not limited to the above embodiments. For example, though each of the above embodiments illustrates an example in which MOSFETs are formed on a semiconductor substrate, the technique of the present invention can also be applied to other semiconductor devices such as an IGBT.

The technical elements disclosed in the specification or the drawings may be utilized separately or in all types of combinations, and are not limited to the combinations set forth in the claims at the time of filing of the application. For example, the technique of the second embodiment (the technique of forming the low-concentration drift region near the side wall surface of the gate trench) can be used singly. That is, even when the breakdown is to occur at the p-n junction between the body region and the drift region during the Avalanche phenomenon, the low-concentration drift region is formed near the side wall surface of each gate trench, thereby preventing holes from being collected near the gate electrode.

The invention claimed is:

1. A semiconductor device comprising:
a first conductive type drift region;
a second conductive type body region disposed on a front surface side of the drift region;
a plurality of gate trenches disposed in a predetermined direction with an interval between one another, each of the plurality of gate trenches penetrating the body region and extending to the drift region;
a gate electrode disposed within each of the plurality of gate trenches and opposing the body region;
an insulator disposed within each of the plurality of gate trenches, each insulator being disposed between the gate electrode and a wall surface of the gate trench; and
a second conductive type diffusion region provided at a bottom portion of each of the plurality of gate trenches to surround the bottom portion, each diffusion region being surrounded by the drift region,
wherein an impurity concentration of each diffusion region is higher than that of the body region, and
wherein in the drift region, an impurity concentration of a part near a side wall surface of the gate trench in the predetermined direction is lower than that of a central part between adjacent diffusion regions.

2. The semiconductor device as in claim 1, wherein a width of each diffusion region in the predetermined direction is longer than that of the diffusion region by which a breakdown voltage of the semiconductor device becomes maximum, and is shorter than a width of the diffusion region by which adjacent diffusion regions contact each other.

3. The semiconductor device as in claim 2, further comprising a blocking region protruding from the side wall surface of the gate trench in the predetermined direction to the drift region, and blocking a carrier flow from the diffusion region toward the gate electrode.

* * * * *

UNITED STATES PATENT AND TRADEMARK OFFICE
CERTIFICATE OF CORRECTION

| | |
|---|---|
| PATENT NO. | : 8,598,652 B2 |
| APPLICATION NO. | : 13/499599 |
| DATED | : December 3, 2013 |
| INVENTOR(S) | : H. Takaya |

It is certified that error appears in the above-identified patent and that said Letters Patent is hereby corrected as shown below:

In the Specification

At column 1, line 4, insert -- This is a 371 national phase application of PCT/JP2009/067186 filed 01 October 2009, the contents of which are incorporated herein by reference. --.

At column 3, line 50, change "(SIC)" to -- (SiC) --.

Signed and Sealed this
Thirteenth Day of May, 2014

Michelle K. Lee
*Deputy Director of the United States Patent and Trademark Office*